United States Patent
Lo et al.

(10) Patent No.: US 9,406,401 B2
(45) Date of Patent: Aug. 2, 2016

(54) 3-D MEMORY AND BUILT-IN SELF-TEST CIRCUIT THEREOF

(71) Applicant: INDUSTRIAL TECHNOLOGY RESEARCH INSTITUTE, Hsinchu (TW)

(72) Inventors: Chih-Yen Lo, Yangmei (TW); Ding-Ming Kwai, Zhubei (TW); Jin-Fu Li, Pingzhen (TW); Yun-Chao Yu, Taipei (TW); Che-Wei Chou, Yunlin County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 421 days.

(21) Appl. No.: 13/655,568

(22) Filed: Oct. 19, 2012

(65) Prior Publication Data

US 2013/0326294 A1    Dec. 5, 2013

(30) Foreign Application Priority Data

May 30, 2012 (TW) .............................. 101119346 A (51) Int. Cl.
*G11C 29/00* (2006.01)
*G11C 29/16* (2006.01)
*G11C 29/26* (2006.01)
*G11C 29/40* (2006.01)

(52) U.S. Cl.
CPC ................ *G11C 29/16* (2013.01); *G11C 29/26* (2013.01); *G11C 29/40* (2013.01)

(58) Field of Classification Search
CPC ........ G11C 29/56; G11C 29/48; G11C 29/44; G11C 29/50; H04K 999/99

USPC .......................................................... 714/718
See application file for complete search history.

(56) References Cited

U.S. PATENT DOCUMENTS

| 5,961,653 A | * | 10/1999 | Kalter ................. G06F 11/2635 714/30 |
| 6,085,346 A | | 7/2000 | Lepejian et al. |
| 6,941,495 B2 | | 9/2005 | Wehage |

(Continued)

FOREIGN PATENT DOCUMENTS

| CN | 1841333 | 10/2006 |
| EP | 1031995 B1 * | 5/2002 |

(Continued)

OTHER PUBLICATIONS

Li Jiang et al. "Modeling TSV Open Defects in 3D-Stacked DRAM" International Test Conference, Paper 6.1, pp. 1-9 (IEEE 2010).

(Continued)

*Primary Examiner* — Albert Decady
*Assistant Examiner* — Enam Ahmed
(74) *Attorney, Agent, or Firm* — McClure, Qualey & Rodack, LLP (57) ABSTRACT

A three-dimensional (3-D) memory includes: multiple memory dies, each having at least one memory bank and a built-in self-test (BIST) circuit; and a plurality of channels, for electrically connecting the memory dies. In a synchronous test, one of the memory dies is selected as a master die. The BIST circuit of the master die sends an enable signal via the channels to the memory dies under test. The BIST circuit in each of the memory dies is for testing memory banks on the same memory die or on different memory dies.

11 Claims, 11 Drawing Sheets

(56) References Cited

U.S. PATENT DOCUMENTS

| | | |
|---|---|---|
| 7,304,355 B2 | 12/2007 | Zhang |
| 7,844,867 B1 * | 11/2010 | Reddy et al. .................. 714/718 |
| 2003/0074611 A1 * | 4/2003 | Nachumovsky ..... G11C 29/006 714/718 |
| 2004/0206982 A1 * | 10/2004 | Lee et al. ...................... 257/200 |
| 2008/0126892 A1 * | 5/2008 | Dubey et al. .................. 714/718 |
| 2009/0303813 A1 * | 12/2009 | Fekih-Romdhane ......... 365/200 |

FOREIGN PATENT DOCUMENTS

| | | |
|---|---|---|
| EP | 1150844 B1 * | 5/2006 |
| TW | I317131 | 11/2009 |
| WO | WO 2007147048 A2 * | 12/2007 |

OTHER PUBLICATIONS

Che-Wei Chou et al. "Yield-Enhancement Techniques for 3D Random Access Memories" IEEE, 2010, pp. 104-107.

Li Jiang et al. "Yield Enhancement for 3D-Stacked Memory by Redundancy Sharing Across Dies" IEEE 2010, pp. 230-234.

Yung-Fa Chou et al. "Yield Enhancement by Bad-Die Recycling and Stacking with Though-Silicon Vias" IEEE Transactions on Very Large Scale Integration (VLSI) Systems, vol. 19, No. 8, Aug. 2011.

Chih-Wea Wang et al. "A Built-In Self-Test and Self-Diagnosis Scheme for Heterogeneous SRAM Clusters" IEEE 2001, pp. 103-108.

English translation of abstract of CN 1841333 (Oct. 4, 2006).

English translation of abstract of TW I317131 (Nov. 11, 2009).

* cited by examiner

FSM of conventional test pattern generator

FIG. 6A

CDC-aware FSM of embodiment

3-D MEMORY AND BUILT-IN SELF-TEST CIRCUIT THEREOF

This application claims the benefit of Taiwan application Serial No. 101119346, filed May 30, 2012, the disclosure of which is incorporated by reference herein in its entirety.

TECHNICAL FIELD

The disclosure relates a three-dimensional (3-D) memory and a built-in self-test (BIST) circuit thereof.

BACKGROUND

Three-dimensional (3-D) integration with through-silicon via (TSV) is a design technique that stacks multiple semiconductor dies. Compared to conventional two-dimensional (2-D) integration, it is capable of providing heterogeneous integration, high performance, high bandwidths, low power consumption, and small form factor. A main challenge that 3-D integration is faced with is the test issue.

A conventional test flow for a 3-D chip includes three phases: known-good die (KGD) test, known-good stack (KGS) test, and final test.

The test flow for a 3-D random access memory (RAM) is no different from the above. After manufacturing a memory wafer, the KGD test for the wafer is performed by a chip probe to determine which memory dies are functional, so as to prevent yield loss of the 3-D RAM caused by stacking bad dies.

In the process of TSV manufacturing and die stacking, it is possible that the good dies become bad. Therefore, defects causing the die stack to fail ought to be filtered out by performing the KGS test.

When all dies are stacked, the final test is performed to ensure that the stacked 3-D RAM is functional.

When performing the KGD test, the TSV cannot be easily tested or contacted directly by the chip probe, and additional test pads are required for assisting related KGD test process. In the 3-D RAM, memory dies are connected via the TSVs to signal terminals, power terminals, and ground terminals. The diameter of the TSV ranges from 1 μm to 10 μm, implying that the test cost will significantly increase if the KGD test is to be performed by directly contacting the TSVs by the chip probe.

A conventional solution is adding a test pad on the dies. The test pads are tailored for assisting the KGD test. Through the test pads, control signals, power and ground terminals can be provided by the current chip probe technique rather than needing a costly chip probe operable with respect to the diameter of the TSV. However, the number of test pads inevitably affects test cost and test time. Further, in the final test, since the dies are already stacked, a direct access to each of the stacked memory dies is also made quite challenging.

Therefore, a 3-D integrated circuit needs standardized test interface for controlling internal test circuits, so as to effectively shorten test time and reduce the number of test pads, as well as to facilitate test integration of different manufacturers.

In a current 3-D RAM, each of the memory dies includes a built-in self-test (BIST) circuit which inherits a conventional test method (to be described shortly) of a memory embedded in a 2-D system-on-chip (SoC). Each of the memory dies further includes a controller with a standardized test interface for controlling the BIST circuit on the same die. The lowermost memory die in the stack may further include a logic circuit such as a processor. The processor can be wrapped with an IEEE 1500 test wrapper for facilitating the test process. The IEEE 1500 test wrapper may have a different operating clock from that of the BIST circuit—the BIST circuit usually operates at a high-speed clock to match a normal operating speed, whereas the IEEE 1500 test wrapper usually operates at a low-speed clock for easing the requirements of the test equipment, as it cooperates with a scan test.

The memory of 2-D SoC generally utilizes a BIST circuit to reduce the high test cost associated with high-speed test equipment. Low-speed test equipment operating at a low speed clock provides commands to a controller of the BIST circuit. In response, the controller sends commands to a test pattern generator (TPG) of the BIST circuit for a memory bank under test. The TPG generates memory read/write address and data (0 or 1) to test the memory bank at a high-speed clock. When a result differs from an expected value, the TPG sends an error message back to the controller to report to the low-speed test equipment.

Figure 1:
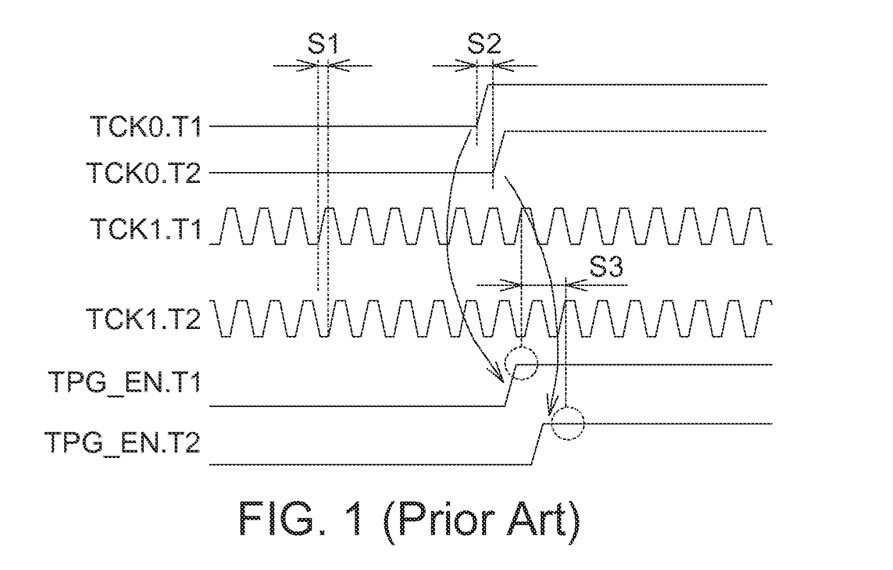
FIG. 1 is a timing diagram of a conventional built-in self-test (BIST) circuit in a 3-D RAM.

FIG. 1 shows a timing diagram of a conventional BIST circuit in a 3-D RAM. TCK0.TN and TCK1.TN respectively represent a low-speed test clock adopted by a controller of the BIST circuit, and a high-speed test clock adopted by a TPG, where N is a positive integer. When the 3-D RAM performs a parallel test, the BIST circuits on different dies execute a user test command synchronously. When a conventional BIST circuit structure is utilized, a clock skew S1 is sustainable during KGS test and final test. However, when the low-speed clock signal, based on which stacked die the controller operates, is affected by the variation of the delay incurred by the TSV, an unexpected skew is also introduced in the low-speed clock signal received by the controller of the BIST circuit, as indicated by a skew S2. Thus, a delay or a skew between enable signals (e.g., TPG_EN.T1 and TPG_EN.T2) received by the TPGs of the BIST circuits of different dies may reach one or more than one high-speed clock cycles, as indicated by a skew S3. Consequently, the test may not be performed synchronously and the overall test quality is degraded.

Considering the structure of the 3-D RAM, each independent channel connects to memory banks on different dies through the TSVs. When performing the KGS test or the final test on the 3-D RAM, some of these memory banks may need to be tested synchronously. In an extreme case, all memory banks of an uppermost die (assuming that the uppermost die is located farthest from a power supply) need to be tested synchronously. Further, because the power consumptions of write and read operations can differ, the BIST circuit needs to guarantee that all memory banks perform read or write operations at the same time to ensure the test is performed in the worst-case condition. Consequently, the memory banks on different dies ought to be activated simultaneously during the test process. That is to say, the test quality of the 3-D RAM is guaranteed only when all corner-case conditions are tested.

SUMMARY

According to one exemplary embodiment, a 3-D memory is provided. The 3-D memory includes: a plurality of memory dies, each having at least one memory bank and a BIST circuit; and a plurality of channels for electrically connecting the memory dies. In a synchronous test, one of the memory dies is selected as the master. The BIST circuit of the master die sends an enable signal via a channel to the memory dies under test. The BIST circuit in each die is for testing the memory banks on the same die or on different dies.

According to an alternative exemplary embodiment, a BIST circuit of a 3-D memory is provided. The BIST circuit includes an inter-die synchronization module and a test pattern generator (TPG). The inter-die synchronization module receives an external test command to determine whether the BIST circuit operates in a master mode or a slave mode. The TPG coupled to the inter-die synchronization module generates a test pattern. When the BIST circuit operates in the master mode, the BIST circuit sends an enable signal of the external test command to other BIST circuits in the slave mode, so that the BIST circuits of the 3-D memory perform a test synchronously. When a BIST circuit operates in the slave mode, the BIST circuit receives the enable signal sent from a BIST circuit in the master mode, so that the BIST circuits of the 3-D memory perform a test synchronously.

In the following detailed descriptions, for the purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
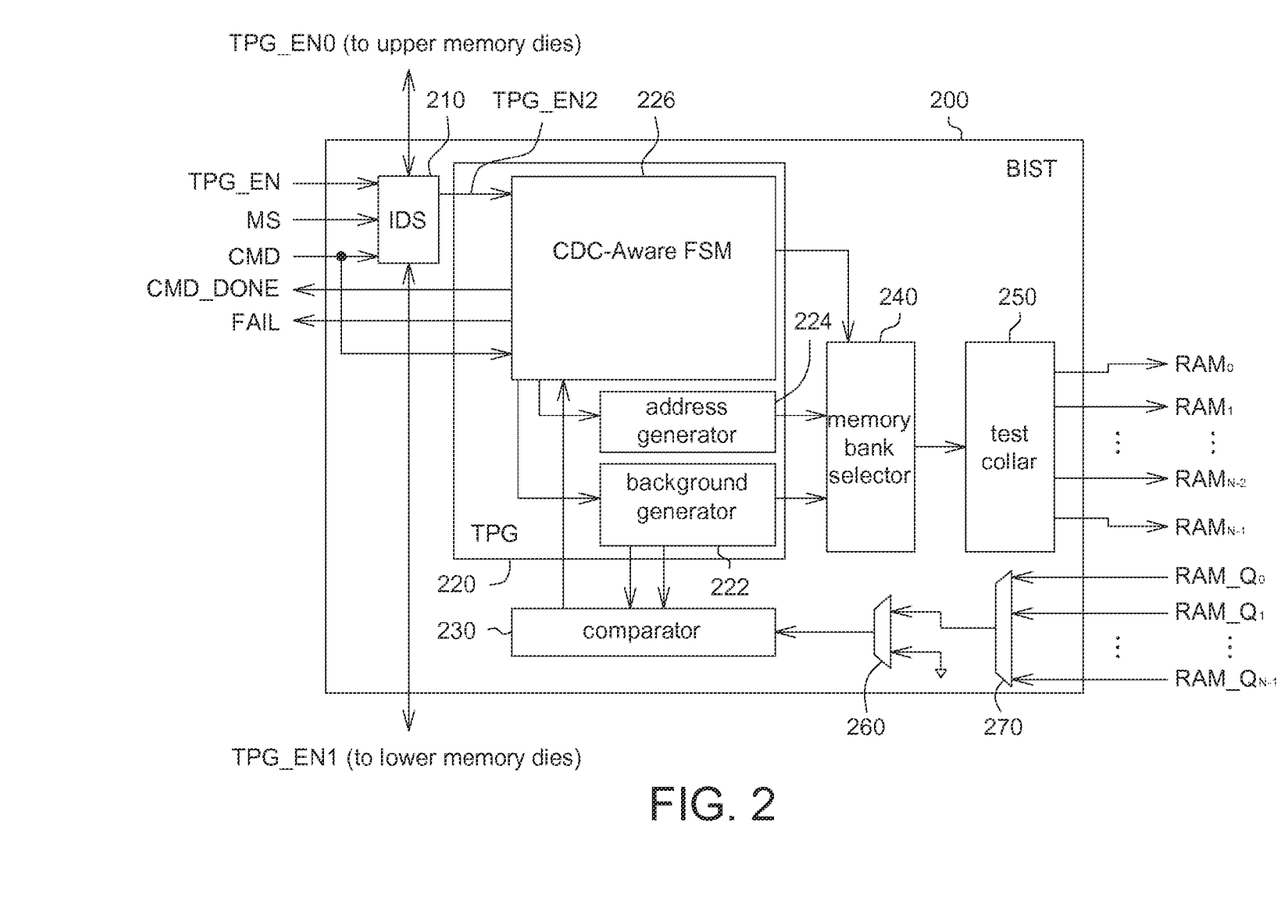
FIG. 2 is a block diagram of a BIST circuit 200 according to an embodiment.

FIG. 2 shows a block diagram of a built-in self-test (BIST) circuit 200 according to an embodiment. The BIST circuit 200 includes an inter-die synchronization module 210, a test pattern generator 220, a comparator 230, a memory bank selector 240, a test collar 250, and multiplexers 260 and 270. The test pattern generator 220 includes a background generator 222, an address generator 224, and a clock-domain-crossing-aware finite state machine (CDC-aware FSM) 226.

Details for generating test patterns by the test pattern generator 220 shall be described shortly. The comparator 230 compares an expected reading with a test result from a memory under test to determine whether the test is correct. For example, the expected reading is generated by the background generator 222. The address generator 224 generates test read/write addresses.

The memory bank selector 240 selects a memory bank to be tested. One memory die may include multiple memory banks. According to a selection result of the memory bank selector 240, the test collar 250 sends a test command, a test address, and test data (if available) to memory banks $RAM_0$ to $RAM_{N-1}$ under test. In FIG. 2, the memory banks $RAM_0$ to $RAM_{N-1}$ under test are not necessarily located on the same die. The multiplexers 260 and 270 send test data $RAM\_Q_0$ to $RAM\_Q_{N-1}$ of the $RAM_0$ to $RAM_{N-1}$ under test to the comparator 230.

An enable signal TPG_EN enables the test pattern generator 220, with details to be described shortly. A multiplexer selecting signal MS determines a selection path of a multiplexer 313 (to be described shortly) in the inter-die synchronization module 210. A command CMD determines a test command to be executed by the memory under test. The enable signal TPG_EN, the multiplexer selection signal MS and the command CMD are provided by an external test machine via a controller (not shown) of the BIST circuit.

A command complete signal CMD_DONE is sent from the test pattern generator 220 to the external test machine via the controller of the BIST circuit to inform the external test machine that the test command is completed. A test failure signal FAIL is sent from the test pattern generator 220 to the external test machine via the controller of the BIST circuit to inform the external test machine that the test is failed.

In this embodiment, to maintain satisfactory test quality for the 3-D RAM in the KGS test and the final test, the inter-die synchronization module 210 in the BIST circuit allows testing synchronously across different dies. The inter-die synchronization module 210 of the BIST circuit of one of the dies is in charge of sending a control signal in a centralized manner to the test pattern generators 220 of the BIST circuits of other dies, so as to eliminate a delay/skew (which may be up to one or more high-speed clock cycles) due to that each BIST circuit receives control signals sent from the controller on the same die.

Figure 3:
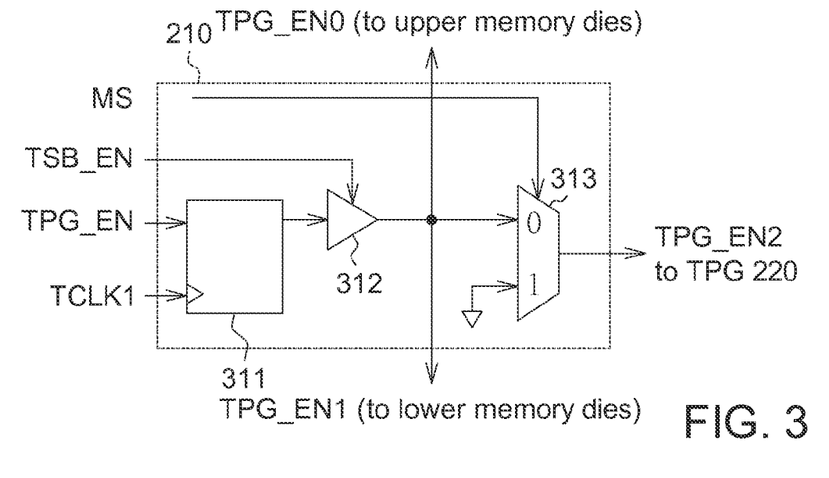
FIG. 3 is a schematic diagram of an inter-die synchronization module 210 according to an embodiment.

FIG. 3 shows a schematic diagram of the inter-die synchronization module 210 of the embodiment. The inter-die synchronization module 210 receives an external test command (for example but not limited by the enable signal TPG_EN, the multiplexer selection signal MS and the command CMD) to determine whether the BIST circuit 200 operates in a master mode or a slave mode. Detailed operations of the inter-die synchronization module 210 are as following. As shown in FIG. 3, the inter-die synchronization module 210 includes a one-bit register 311, a tri-state buffer 312 and a multiplexer 313.

The one-bit register 311, triggered by a same high-frequency clock signal TCK1 as the BIST circuit 200, receives the enable signal TPG_EN (also regarded as the enable signal of the BIST circuit 200). The multiplexer 313 is controlled by the multiplexer selection signal MS to select a ground signal VSS or an output signal of the tri-state buffer 312 (of the same die or a different die) for output. The tri-state buffer 312 is controlled by a tri-state buffer enable signal TSB_EN in the command CMD. Output ports of the tri-state buffers 312 of different dies are interconnected by through-silicon vias (TSVs), which are for transmitting signals to upper/lower memory dies (via TPG_EN0/TPG_EN1).

When the tri-state buffer enable signal TSB_EN is logic high, the tri-state buffer 312 outputs the enable signal TPG_EN temporarily stored in the one-bit register 311 to the TPG 220 on the same die (via TPG_EN2) and to that on a different die (via TPG_EN0 or TPG_EN1). Conversely, when the tri-state buffer enable signal TSB_EN is logic low, the output of the tri-state buffer 312 is set to high impedance and does not output the enable signal TPG_EN temporarily stored in the one-bit register 311.

Taking FIG. 3 for example, assume that a tri-state buffer 312 receives a logic high tri-state buffer enable signal TSB_EN. The tri-state buffer 312 sends the enable signal TPG_EN2 to the test pattern generator 220 of the same die, TPG_EN0 to an upper die, and TPG_EN1 to a lower die. If, on the other hand, tri-state buffer 312 receives a logic low tri-state buffer enable signal TSB_EN, the tri-state buffer 312 does not output the enable signal TPG_EN, and the multiplexer selection signal MS is set to logic low, so that the multiplexer 313 sends the enable signal TPG_EN from the another die to the TPG 220.

Figure 4:
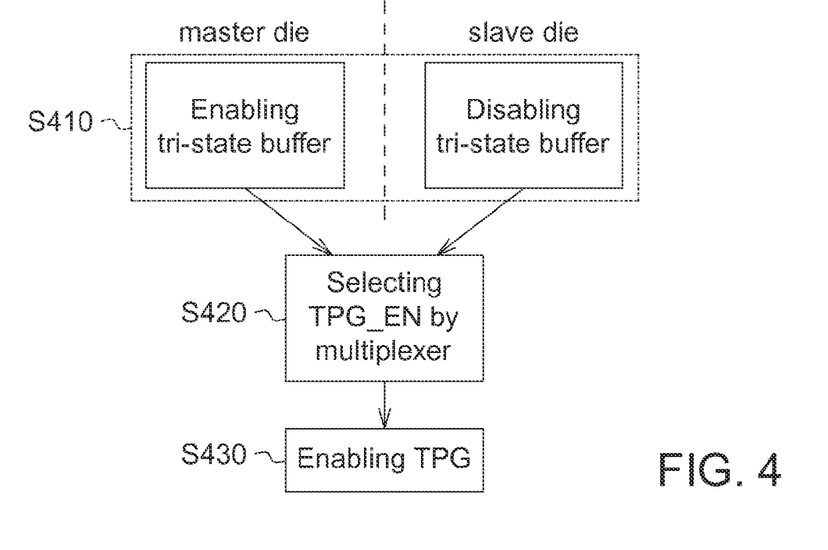
FIG. 4 is a flowchart of operations of the inter-die synchronization module 210 according to an embodiment.

Referring to FIG. 4 showing a flowchart, operation details of the inter-die synchronization module 210 of the embodiment shall be described below.

In this embodiment, the signals input into the inter-die synchronization module 210 include: the multiplexer selection signal MS (a low-speed signal provided by the test machine via the controller of the BIST circuit), the tri-state buffer enable signal TSB_EN (a low-speed signal provided by the test machine via the controller of the BIST circuit), the enable signal TPG_EN (a low-speed signal provided by the test machine via the controller of the BIST circuit), and the clock signal TCLK1 (a high-speed signal). The multiplexer selection signal MS determines whether the output signal of the multiplexer 313 is the output signal of the tri-state buffer 312 (on the same die or on a different die) or VSS. The tri-state buffer signal TSB_EN determines whether the output signal of the tri-state buffer 312 is the TPG_EN signal stored in the one-bit register 311 or in a high-impedance state. The enable signal TPG_EN is the enable signal for the test pattern generator 220. The clock signal TCLK1 is the clock signal utilized in the high-speed test.

The output signals from the inter-die synchronization module 210 include TPG_EN0 to TPG_EN2. The signal TPG_EN0 is sent to an upper memory die, the signal TPG_EN1 is sent to a lower memory die, and the signal TPG_EN2 is sent to the same memory die.

Referring to FIG. 4, in Step S410, the tri-state buffer of the master die is enabled, whereas the tri-state buffers of the slave dies are disabled. Throughout the specification, the BIST circuit of a master die is operated in a master mode, and the BIST circuit of a slave die is operated in a slave mode.

In Step S420, each of the multiplexers 313 of all dies under test selects an appropriate path, and outputs the enable signal TPG_EN (sent in a centralized manner from the master die). The multiplexers 313 of all dies under test further select the input signals of the input terminals "0". More specifically, the multiplexer 313 of the master die selects the signal TPG_EN outputted by the tri-stated buffer 312 on the same die, whereas the multiplexers 313 of the slave dies select the signal TPG_EN outputted by the tri-state buffer 312 of the master die (via TPG_EN0 or TPG_EN1).

In Step S430, the test pattern generators 220 of all dies under test are enabled by the enables signals TPG_EN0 to TPG_EN2 sent from the inter-die synchronization module 210 of the master die. More specifically, in Step S430, the test pattern generator 220 of the master die is enabled by the enable signal TPG_EN2 outputted by the multiplexer 313 on the same die, whereas the test pattern generators 220 of the slave dies are enabled by the enable signal TPG_EN0 or TPG_EN2 from the inter-die synchronization module 210 of the master die.

Figure 5A:
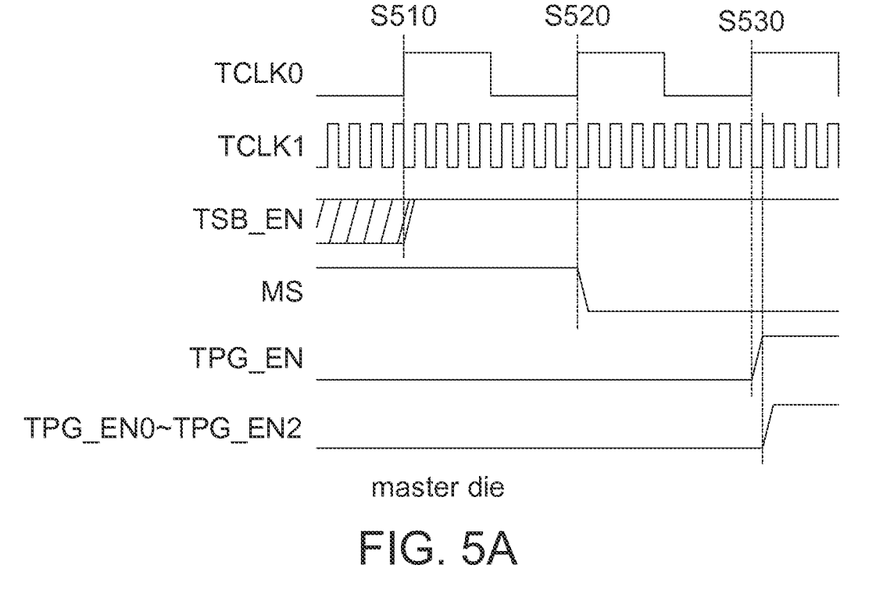
FIG. 5A and FIG. 5B are timing diagrams of an inter-die synchronization module 210 of a master die and an inter-die synchronization module 210 of a slave die according to an embodiment.
Figure 5B:
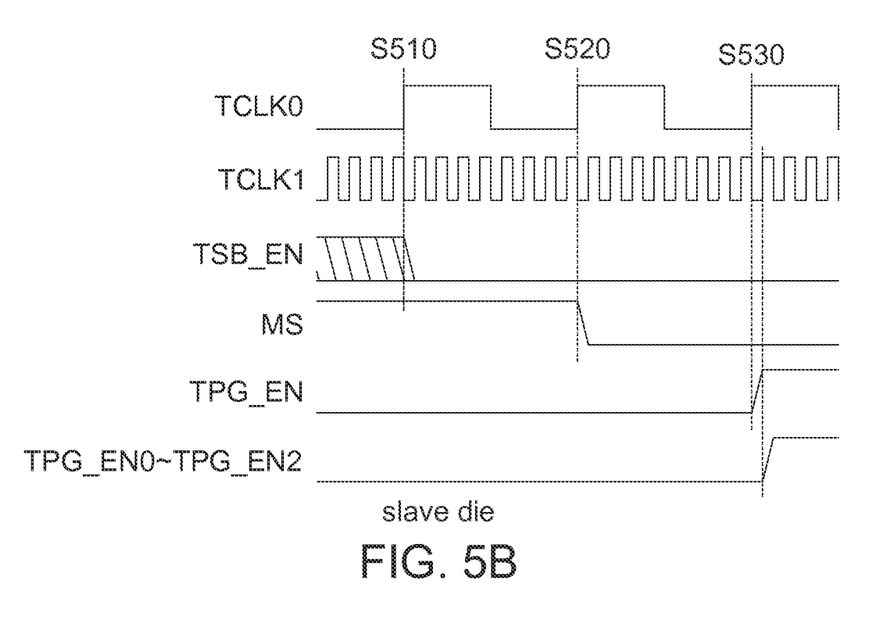

FIG. 5A and FIG. 5B respectively are timing diagrams of the inter-die synchronization modules 210 of the master die and the slave die according to an embodiment. The timing of the inter-die synchronization module 210 of the master die is as shown in FIG. 5A. Before Step S510, the signal TSB_EN is a "don't care" signal, and the signals MS and TPG_EN are disabled.

In Step S510, the controller of the BIST signal is triggered by the clock signal TCLK0 to generate the signal TSB_EN for enabling the tri-state buffer 312, so that the output value of the one-bit register 311 may be outputted by the tri-state buffer 312 (since the tri-state buffer 312 is enabled).

In Step S520, the clock signal TCLK0 triggers the multiplexer selection signal MS, and the output signal of the multiplexer 313 is switched to the input signal of the input terminal "0".

In Step S530, the clock signal TCLK0 triggers the enable signal TPG_EN to enable the BIST circuit 200 (i.e., to enable the test pattern generator 220). The one-bit register 311 is triggered by the clock signal TCLK1 to fetch the signal TPG_EN, and the tri-state buffer 312 sends the signal TPG_EN stored in the one-bit register 311 on the master die to its output terminal, which becomes the signals TPG_EN0 to TPG_EN2.

The operation timing of the inter-die synchronization module 210 on the slave die is as shown in FIG. 5B. By comparing FIG. 5A and FIG. 5B, it is observed that a difference between the operations of the slave die and the master die is that, the tri-state buffer 312 on the slave die is not enabled. That is to say, the enable signal for the test pattern generator on the slave die is sent from the inter-die synchronization module 210 of the master die, and is transmitted via the signal TPG_EN0 or TPG_EN1 through the TSV.

Figure 6A:
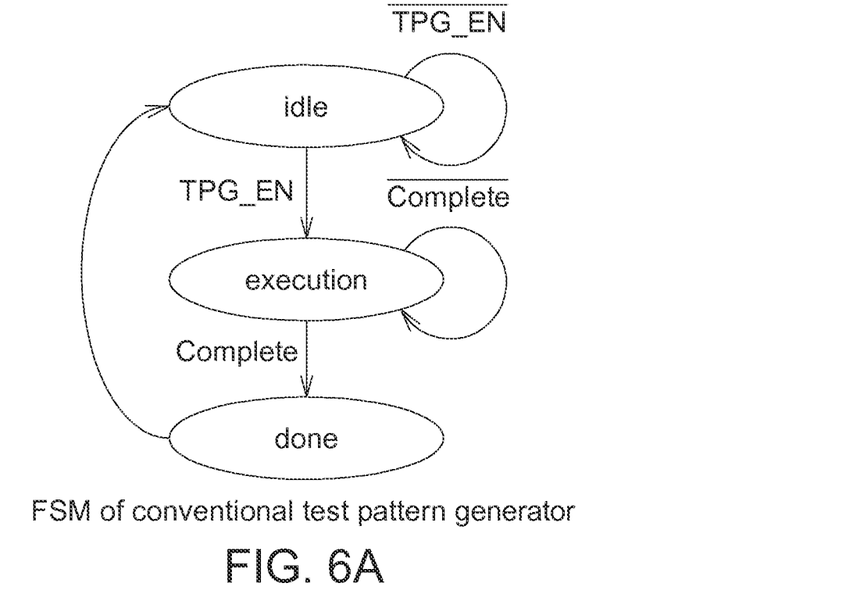
FIG. 6A and FIG. 6B are respectively an FSM of a conventional test pattern generator, and a clock-domain-crossing-aware finite state machine (CDC-aware FSM) in a test pattern generator according to an embodiment.
Figure 6B:
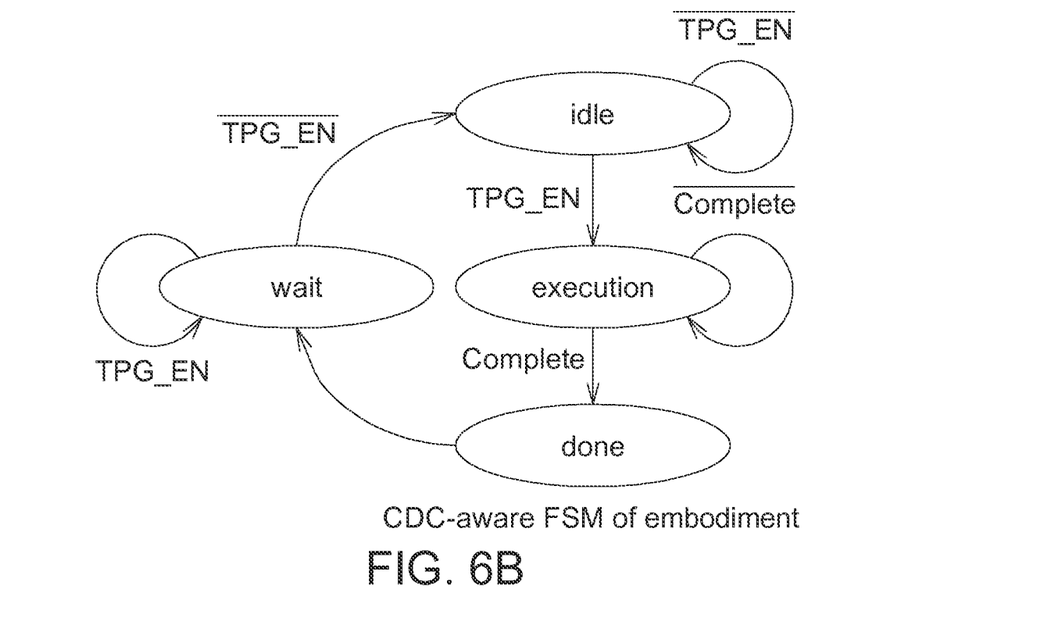

FIG. 6A and FIG. 6B respectively show an FSM of a conventional test pattern generator and the CDC-aware FSM 226 in the test pattern generator according to an embodiment. Referring to FIG. 6A, the FSM of the conventional test pattern generator is initially at an idle state. When the enable signal TPG_EN is enabled, the FSM of the conventional test pattern generator enters an execution state for executing test tasks. When all of the test tasks are completed, the FSM of the conventional test pattern generator enters a done state, and reports a result to an external (e.g., a test machine) to inform the external that all of the tasks are completed. The FSM of the conventional test pattern generator then returns to the idle state.

Referring to FIG. 6B, apart from the idle, execution and done states, the CDC-aware FSM 226 according to an embodiment additionally includes a wait state. In between a period of returning from the done state to the idle state, the CDC-aware FSM 226 of the embodiment detects whether the enable signal TPG_EN is disabled in the wait state. When the enable signal TPG_EN changes from enabled to disabled, the CDC-aware FSM 226 of embodiment returns from the wait state to the idle state. Conversely, when the enable signal TPG_EN is still enabled, the CDC-aware FSM 226 of the embodiment remains at the wait state.

Figure 6C:
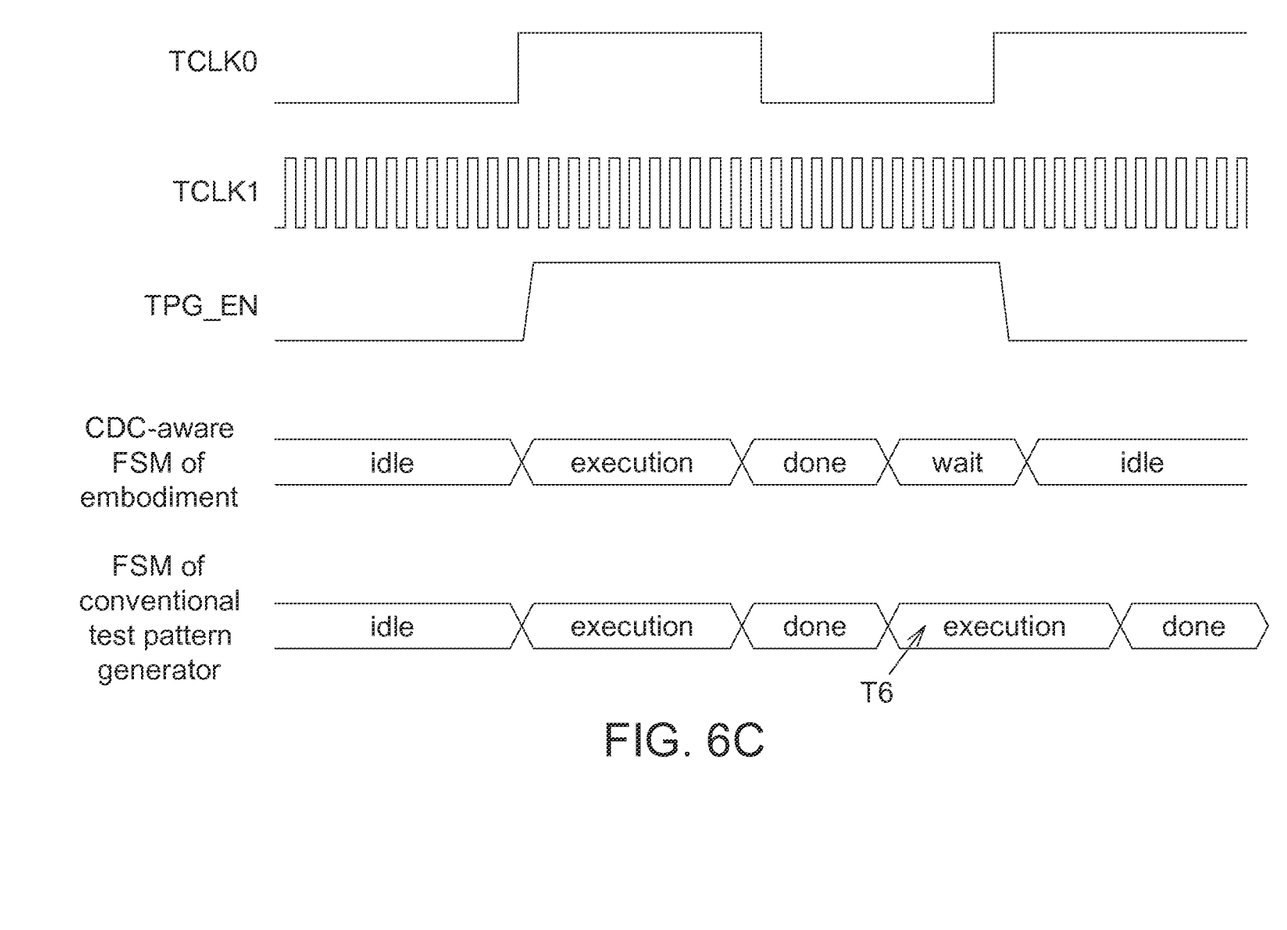
FIG. 6C is a timing diagram of an FSM of a conventional test pattern generator and a CDC-aware FSM of an embodiment.

FIG. 6C shows a timing diagram of an FSM of a conventional test pattern generator and the CDC-aware FSM 226 of the embodiment. As execution of tasks is completed, the FSM of the conventional test pattern generator enters the done state. Assuming that a read test is to be performed on three dies, the FSM of the conventional test pattern generator of the memory die having already completed the read test enters the done state, and reports the test result to the test machine. Since the enable signal TPG_EN is a low-speed signal, before the test machine sets the enable signal TPG_EN to disabled, the FSM of the conventional test pattern generator of the memory die (having already completed the read test) again enters the execution status due to the fact that the enable signal TPG_EN still enabled is detected. Consequently, the execution (as indicated by T6 in FIG. 6C) is not only redundant but may even undesirably affect the test result.

The CDC-aware FSM 226 of the embodiment is capable of preventing the above issue. After completing the tasks, the CDC-aware FSM 226 of the embodiment first enters the waiting state, and enters the idle state only when the enable signal TPG_EN is disabled. Therefore, unlike the FSM of the conventional pattern generator, the CDC-aware FSM 226 of the embodiment does not execute any redundant tasks or undesirably affect the test result.

Figure 7A:
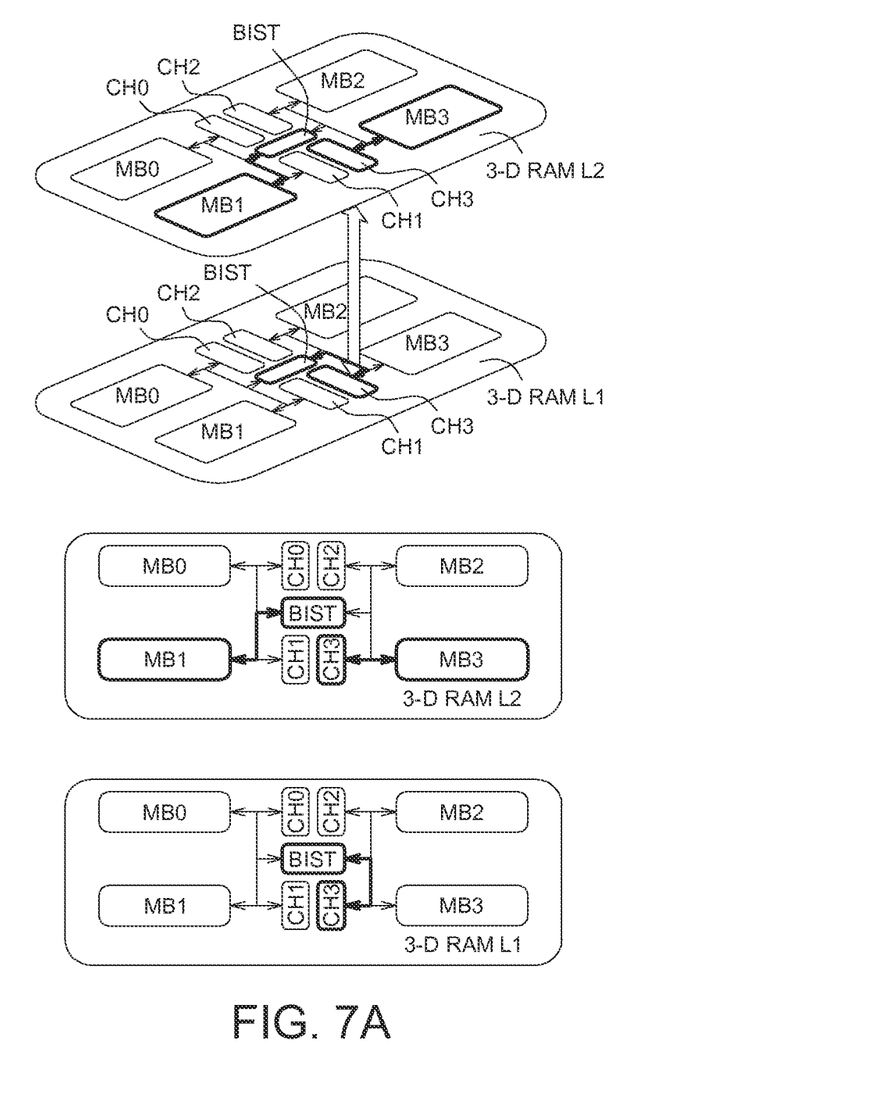
FIG. 7A to FIG. 7C are several possible test situations according to an embodiment.

Several possible test situations of the embodiment shall be described below. As shown in FIG. 7A, assume that memory banks MB1 and MB3 on a memory die L2 are to be tested. In this embodiment, the memory bank MB1 on memory die L2 may be tested by the BIST circuit on the same die, and the memory bank MB3 on memory die L2 may be tested by the BIST circuit of a lower memory die L1. The memory bank MB3 on memory die L2 is connected to the BIST circuit on memory die L1 by a channel CH3. Thus, as observed from FIG. 7A, in this embodiment, because the BIST circuit on a die not under test is used in testing other dies, a test bandwidth is effectively increased when testing a stacked memory.

Figure 7B:
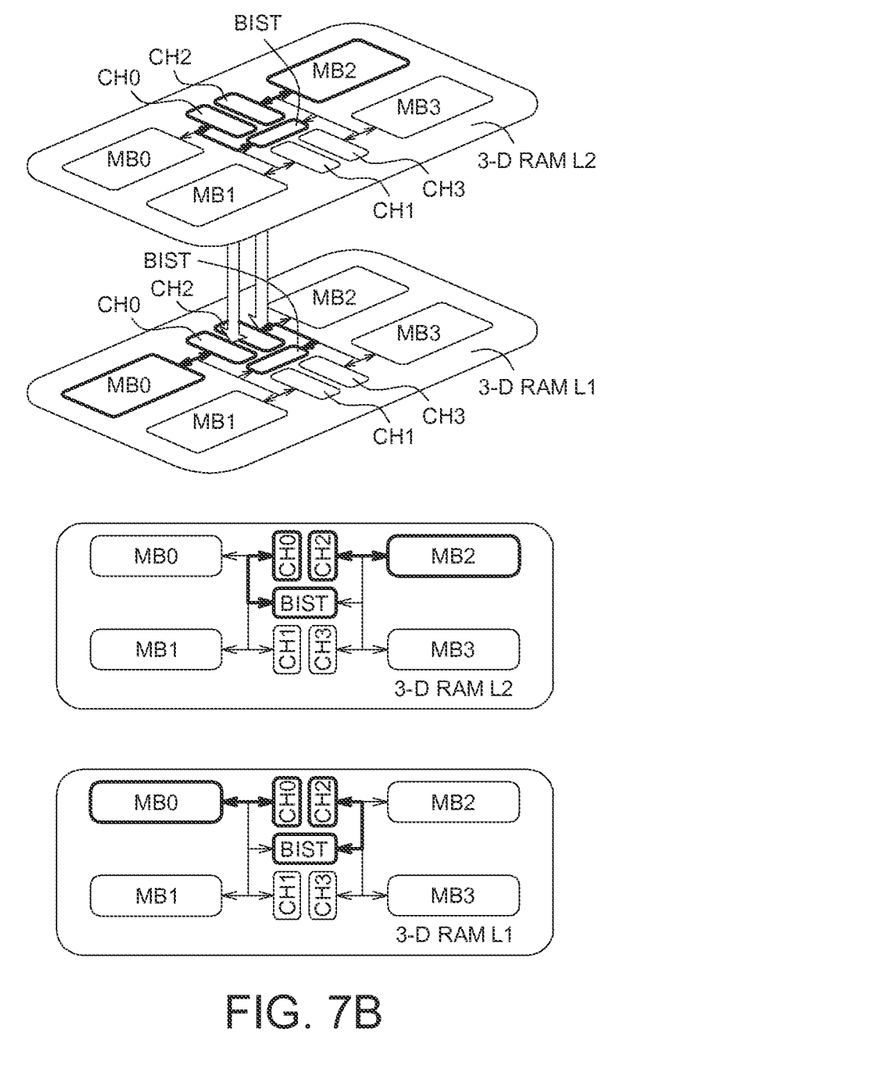

Referring to FIG. 7B, assume that a memory bank MB2 on memory die L2 and a memory bank MB0 on memory die L1 are to be tested. In this embodiment, the memory bank MB2 on memory die L2 may be tested by the BIST circuit on memory die L1, and the memory bank MB0 on memory die L1 may be tested by the BIST circuit on memory die L2. In the test situations in FIG. 7B, two channels may also be tested at the same time (i.e., two sets of TSVs can also be tested at the same time) to filter and identify peripheral circuit defects resulted by abnormal TSVs.

Figure 7C:
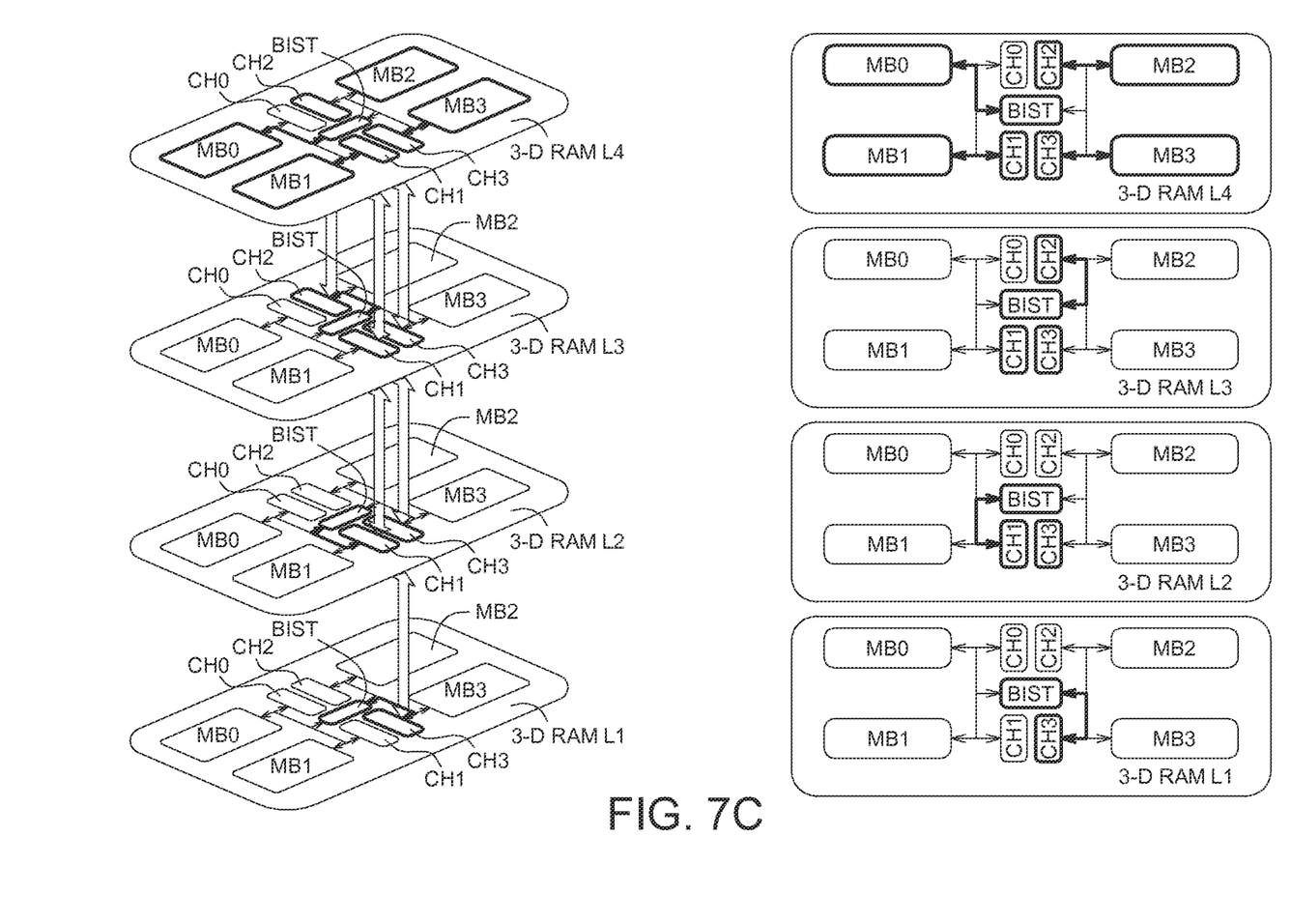

FIG. 7C shows a situation of synchronously testing multiple memory banks on a same die according to an embodiment. Assume that four memory banks MB0 to MB3 on a memory die L4 are to be tested. It is observed from FIG. 7C that, the four memory banks can be respectively tested by four BIST circuits on four memory dies. Therefore, the embodiment is still capable of performing a synchronous test of four memory banks on a same single die in a four-die stacked structure.

It is seen from FIGS. 7A to 7C that, in the embodiment, the BIST circuit on any die (regardless of the master die or the slave die) may be implemented to test the memory banks on the same die or on other dies.

As previously described, the embodiment is capable of simultaneously testing multiple memory banks on a same die, and so the number of comparators in the BIST circuit is in principle equal to the number of memory banks on the same die. However, when performing the KGD test, the number of power pads is limited due to area considerations, meaning that the number of memory banks that can be simultaneously tested during the KGD test is limited as well. Further, in the KGS and final tests, among memory banks on different dies connected to a same channel, only one memory bank on one die can be tested or activated. On the other hand, when the number of comparators in the BIST circuit matches the number of memory banks on the same die, the comparators are likely to be idle during a test/operation after stacking. Thus, in the embodiment, the comparator in the BIST circuit on one die can be shared by other dies to reduce test cost.

Figure 8:
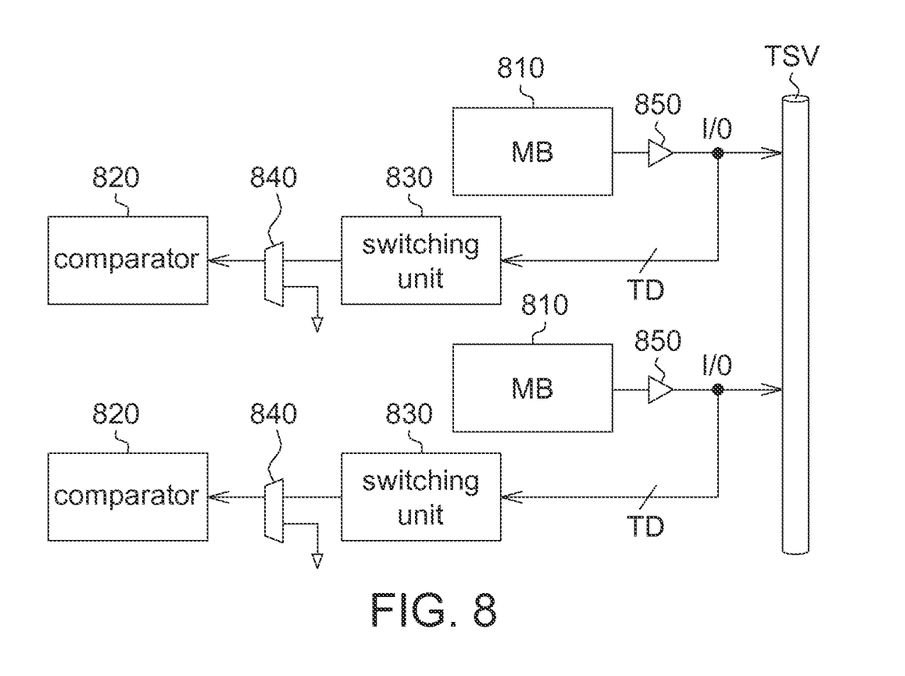
FIG. 8 is a schematic diagram of comparators 820 shared by inter-dies for explaining how the comparators 820 of different dies compare test results of memory banks according to an embodiment.

FIG. 8 shows a schematic diagram of comparators 820 shared by inter-dies for explaining how the comparators 820 compare test results of memory banks on different dies according to an embodiment. For example, two memory banks 810 may be memory banks on different dies. Test result data TD of the memory banks 810 under test may be transmitted to the comparators 820 (equivalent to the comparator 230 in FIG. 2) of the BIST circuits on different dies via TSVs, switching units 830 (equivalent to the multiplexer 270 in FIG. 2) and multiplexers 840 (equivalent to the multiplexer 260 in FIG. 2). Tri-state buffers 850 determine whether the memory banks MB 810 under test send result data.

Figure 9:
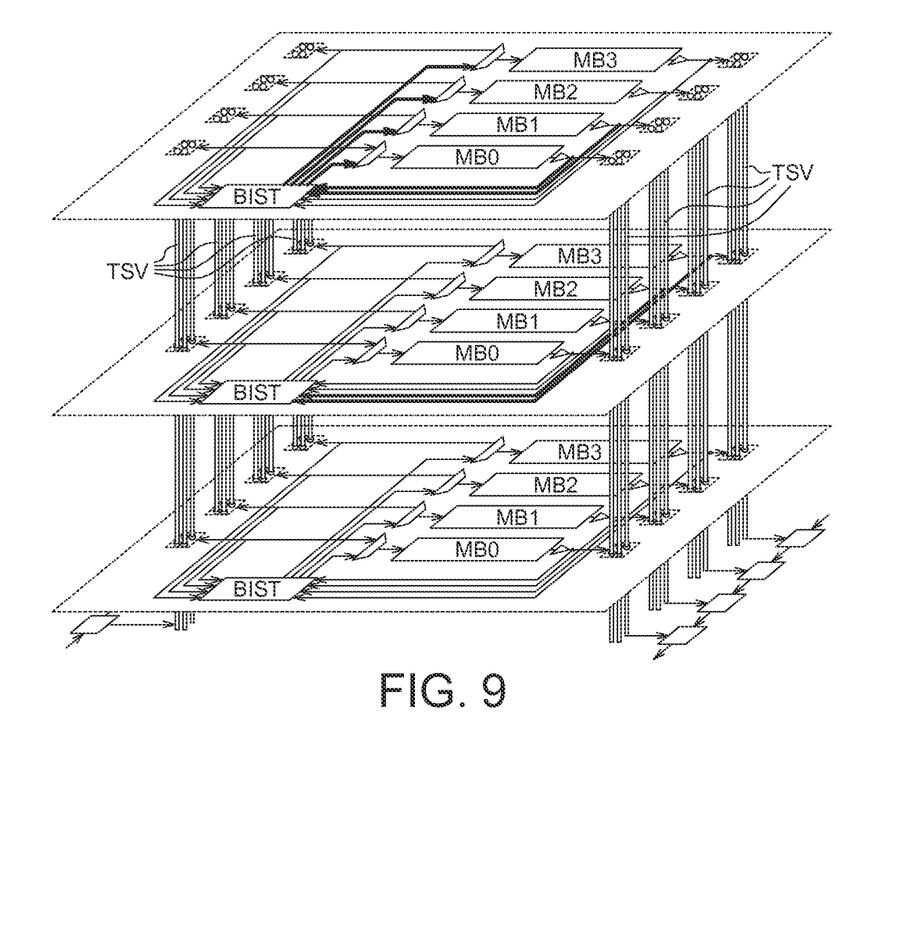
FIG. 9 is a complete view of an inter-die test of a 3-D RAM according to an embodiment.

FIG. 9 shows a complete view of an inter-die test of a 3-D RAM according to an embodiment. Referring to FIG. 9, assume that multiple memory banks MB0 to MB3 on a same die are to be tested. A test pattern and an enable signal for the test may be sent from a BIST circuit of a master die. In the memory banks to be tested, the test data of two (for example) memory banks may be sent to and compared in the BIST circuit on the same die, whereas the test data of the other two memory banks under test may be sent to and compared in the BIST circuit on another die.

Figure 10:
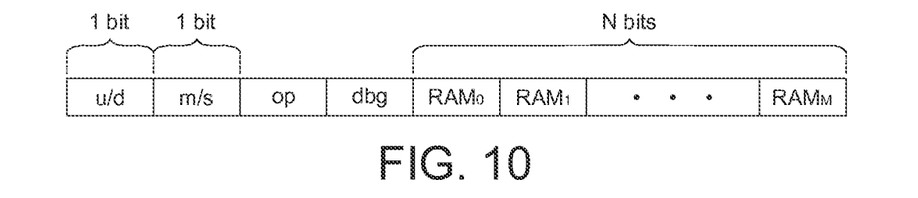
FIG. 10 is a format of a test command according to an embodiment.

In this embodiment, a command format for the BIST circuit is programmable. The command programmability and the versatility in memory bank selection offers multiple test patterns and multiple combinations of memory banks to be tested for testing a 3-D memory. Thus, the memory banks may be adaptively selected to satisfy test requirements of a 3-D memory. FIG. 10 shows an exemplary format of a test command according to an embodiment. In FIG. 10, a field "m/s" represents whether the BIST circuit on the same die operates in the master mode or in the slave mode. When the BIST circuit operates in the master mode, the inter-die synchronization module 210 of the master mode sends the enable signal TPG_EN on the same die to the test pattern generators 220 on the same die and all slave dies. When the BIST circuit operates in the slave mode, although being programmed to execute a predetermined test command, the inter-die synchronization module 210 on the slave die starts test after receiving the enable signal TPG_EN0 or TPG_EN1 sent from the test pattern generator of the inter-die synchronization module 210 of the master die. For N-bit fields $RAM_0$ to $RAM_{N-1}$ (where N represents the number of memory banks on a die), to test $RAM_i$ (where i is a positive integer between 0 to N−1), the field representing $RAM_i$ is set to 1, or else it is set to 0. To test multiple memory banks, multiple corresponding fields are set to 1. The BIST circuits on different dies then test the memory banks according to respective test commands. A field "u/d" determines whether an address of the memory counts up or counts down; a field "dbg" determines which test pattern is to be used for the test.

Therefore, it is demonstrated in the foregoing embodiments that, the BIST circuit of a 3-D RAM adopting TSV offers a programmable function, which is capable of simulating multiple access combinations of the 3-D RAM in normal operating situations so that multiple corner-case conditions of the 3-D RAM in a test are simulated.

In a conventional solution, an issue of an asynchronous test may be resulted by a TSV delay among BIST circuits on different dies. In the foregoing embodiments, the inter-die synchronization module 210 in the BIST circuit solves the asynchronous test. Further, in the foregoing embodiments, the CDC-aware FSM 226 also effectively prevents the BIST circuit from repeatedly executing a test command.

In the foregoing embodiments, the comparator 230 is shared by the BIST circuits 200 on different dies to reduce test cost of the 3-D RAM.

In the foregoing embodiments, after stacking the dies, the BIST circuit 200 can be shared by other dies to enhance test performance as well as test bandwidth.

In the foregoing embodiments, after stacking the dies, an inter-die test is possible to check peripheral circuit defects resulted by the TSVs.

Further, in the foregoing embodiments, through the built-in inter-die test synchronization mechanism, possible multiple corner-case conditions of a 3-D memory are simulated for checking system errors related to heat dissipation to maintain and optimize test quality.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three-dimensional (3-D) memory, comprising:
a plurality of memory dies, each having at least one memory bank and a built-in self-test (BIST) circuit; and
a plurality of channels, for electrically connecting the memory dies;
wherein, in a synchronous test, any one of the memory dies is selected as a master die, the BIST circuit on the master die sends an enable signal to other memory die or dies via the channels, and the BIST circuits in the plurality of the memory dies test the memory banks on one same memory die or on different memory dies,
wherein the plurality of the BIST circuits in the plurality of memory dies have the same circuit configuration; and
wherein the BIST circuit on the master die has the same circuit configuration as the BIST circuits on other memory dies.

2. The 3-D memory according to claim 1, wherein when testing the memory banks on the master die, the BIST circuit on the master die tests one of the memory banks on the master die, and the BIST circuit of at least one other memory die tests another of the memory banks on the master die.

3. The 3-D memory according to claim 1, wherein when testing one of the memory banks on the master die and one of the memory banks on another memory die, the BIST circuit on the master die tests the memory bank under test on the master die, and the BIST circuit on the another memory die tests the memory bank under test on the another memory die.

4. The 3-D memory according to claim 1, wherein when testing one of the memory banks on the master die and one of the memory banks on another memory die, the BIST circuit on the master die tests the memory bank under test on the another memory die, and the BIST circuit on the another memory die tests the memory bank under test on the master die.

5. The 3-D memory according to claim 1, wherein when testing the memory banks on another memory die, the BIST circuit on the master die tests one of the memory banks under test on the another memory die, and the BIST circuit on the another memory die tests another of the memory banks on the another memory die.

6. A built-in self-test (BIST) circuit of a 3-D memory, comprising:

an inter-die synchronization module, for receiving an external test command to determine whether the BIST circuit operates in a master mode or in a slave mode; and
a test pattern generator, coupled to the inter-die synchronization module, for generating a test pattern;
wherein, when the BIST circuit operates in the master mode, the BIST circuit sends an enable signal of the external test command to the BIST circuits in the slave mode of the 3-D memory, so that the BIST circuits of the 3-D memory perform a synchronous test; and
when the BIST circuit operates in the slave mode, the BIST circuit receives the enable signal sent from the BIST circuit in the master mode, so that the BIST circuits of the 3-D memory perform the synchronous test,
wherein the BIST circuit operated in the master mode has the same circuit configuration as the BIST circuits operated in the slave mode.

7. The BIST circuit according to claim 6, wherein the inter-die synchronization module comprises:
a register, for temporarily storing the enable signal;
a tri-state buffer, coupled to the register, controlled by a tri-state buffer enable signal to output the enable signal temporarily stored in the register or to be in a high-impedance state; and
a multiplexer, coupled to the tri-state buffer and the test pattern generator, for outputting a ground signal, an output signal of the tri-state buffer or the enable signal outputted by another BIST circuit.

8. The BIST circuit according to claim 7, wherein
the tri-state buffer outputs the enable signal temporarily stored in the register when the BIST circuit operates in the master mode, and
the tri-state buffer is in the high-impedance state when the BIST circuit operates in the slave mode.

9. The BIST circuit according to claim 6, wherein the test pattern generator comprises a clock-domain-crossing-aware finite state machine (CDC-aware FSM) coupled to the inter-die synchronization module, and the CDC-aware FSM has an idle state, an execution state, a done state and a wait state.

10. The BIST circuit according to claim 9, wherein:
when the enable signal is enabled, the CDC-aware FSM enters the execution state from the idle state to execute a test task;
when the test task is completed, the CDC-aware FSM enters the done state from the execution state, and reports a test result to inform that the test task is completed;
when the enable signal is still enabled, the CDC-aware FSM enters the wait state from the done state; and
in response to the enable signal changing from enabled to disabled, the CDC-aware FSM returns to the idle state from the wait state.

11. The BIST circuit according to claim 6, further comprising at least one comparator, wherein there is an equal number of comparators and associated memory banks on a same die as the BIST circuit.

* * * * *